(12) United States Patent
Inoue et al.

(10) Patent No.: US 6,998,687 B2
(45) Date of Patent: Feb. 14, 2006

(54) SURFACE ACOUSTIC WAVE (SAW) DEVICE

(75) Inventors: Takashi Inoue, Osaka (JP); Satoshi Matsuo, Osaka (JP); Akihiko Namba, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 262 days.

(21) Appl. No.: 10/240,426

(22) PCT Filed: Jan. 24, 2002

(86) PCT No.: PCT/JP02/00498

§ 371 (c)(1),
(2), (4) Date: Mar. 7, 2003

(87) PCT Pub. No.: WO02/061943

PCT Pub. Date: Aug. 8, 2002

(65) Prior Publication Data

US 2003/0164529 A1    Sep. 4, 2003

(51) Int. Cl.
*H01L 27/14* (2006.01)

(52) U.S. Cl. .................. 257/414; 257/416; 257/795
(58) Field of Classification Search ................ 257/414, 257/416, 634, 701, 678, 787, 788, 795, 11, 257/21, 456; 310/313, 348, 328, 364–366, 310/357–359
See application file for complete search history.

(56) References Cited

U.S. PATENT DOCUMENTS 6,078,123 A    6/2000    Tanaka et al.

FOREIGN PATENT DOCUMENTS

| JP | 60-054458 A | | 3/1985 |
|---|---|---|---|
| JP | 62-150752 A | | 7/1987 |
| JP | 63-81957 | | 4/1988 |
| JP | 63-310938 A | | 12/1988 |
| JP | 03-222443 A | | 10/1991 |
| JP | 63081957 | * | 4/1998 |
| JP | 10163799 A | * | 6/1998 |
| JP | 10-163799 | | 6/1998 |
| JP | 11-163661 | | 6/1999 |
| JP | 11163661 | * | 6/1999 |
| JP | 2000-58593 | | 2/2000 |
| WO | WO99/05788 | | 2/1999 |

OTHER PUBLICATIONS

Japanese Search report for PCT/JP02/00498 dated Mar. 26, 2002.

European Search Report for Application No. EP 02 71 6356, dated Feb. 15, 2005.

* cited by examiner

*Primary Examiner*—Tuan H. Nguyen
(74) *Attorney, Agent, or Firm*—RatnerPrestia

(57) ABSTRACT

A surface acoustic wave (SAW) device having improved moisture resistance is provided. The device includes a piezoelectric substrate, an interdigital transducer (IDT) electrode on a first surface of the piezoelectric substrate, and a resin coating for covering the IDT electrode. After a piece of resin material of the resin coating is dipped in an amount of pure water as solvent having a mass as 10 times great as the piece of resin material at 120° C. under 2 atom pressure for twenty hours, a concentration of chlorine ion in the solvent is not higher than 50 ppm.

11 Claims, 5 Drawing Sheets

SURFACE ACOUSTIC WAVE (SAW) DEVICE

This Application is a U.S. National Phase Application of PCT International Apllication PCT/JP02/00498.

FIELD OF THE INVENTION

The present invention relates to a surface acoustic wave (SAW) device for use in a radio communication apparatus or the like and a method of manufacturing the device.

BACKGROUND OF THE INVENTION

A conventional surface acoustic wave (SAW) device is disclosed in Japanese Patent Laid-Open No.11-163661. FIG. 10 is an enlarged cross sectional view of a primary part of the SAW device. The SAW device includes a piezoelectric substrate 1 made of mono-crystal material, such as lithium tantalate, and interdigital transducer (IDT) electrodes 2 on the surface of the piezoelectric substrate 1. The IDT electrode 2 includes an upper layer 5 and a lower layer 3 both made of aluminum alloy containing titanium and an intermediate layer 4 made of Cu, Si, Ge, or the like for preventing aluminum alloy crystalline particles from growing and for reducing the local cell corrosion.

The IDT electrode 2 is made of the aluminum alloy at its top. Therefore, when being exposed to high-moisture atmosphere for a considerable length of time, the electrodes may cause aluminum in it to be corroded, thus declining its properties.

SUMMARY OF THE INVENTION

A surface acoustic wave (SAW) device has a high moisture resistance. The device includes a piezoelectric substrate, an interdigital transducer (IDT) electrode on a first surface of the piezoelectric substrate, and a resin coating for covering the IDT electrode. After a piece of resin material of the resin coating is dipped in an amount of pure water as solvent having a mass as 10 times great as the piece of resin material at 120° C. under 2 atom pressure for twenty hours, a concentration of chlorine ion in the solvent is not higher than 50 ppm.

DESCRIPTION OF THE PREFERRED EMBODIMENTS (Embodiment 1)

Figure 1:
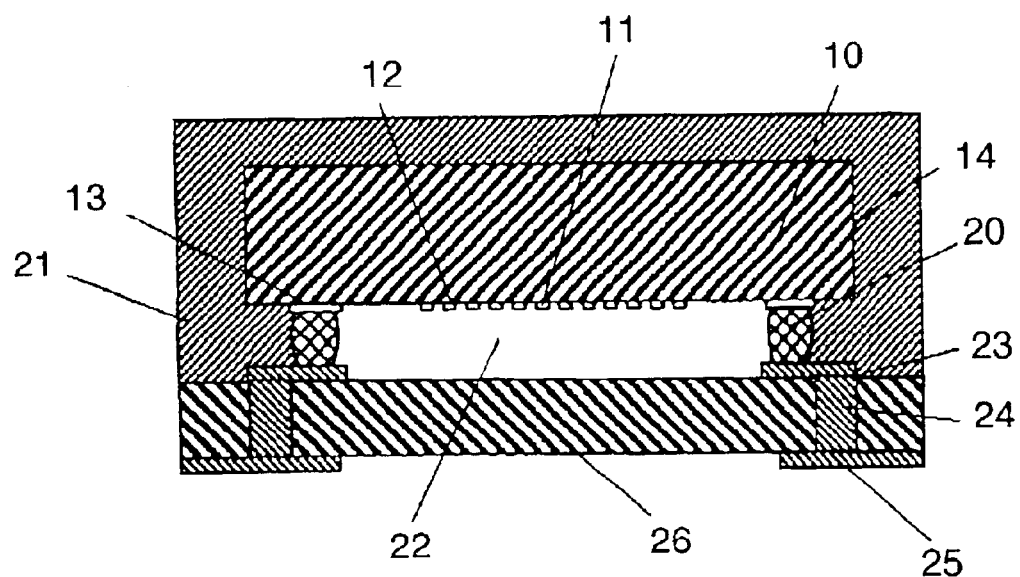
FIG. 1 is a cross sectional view of an SAW device according to Embodiments 1 to 9 of the present invention.
Figure 2:
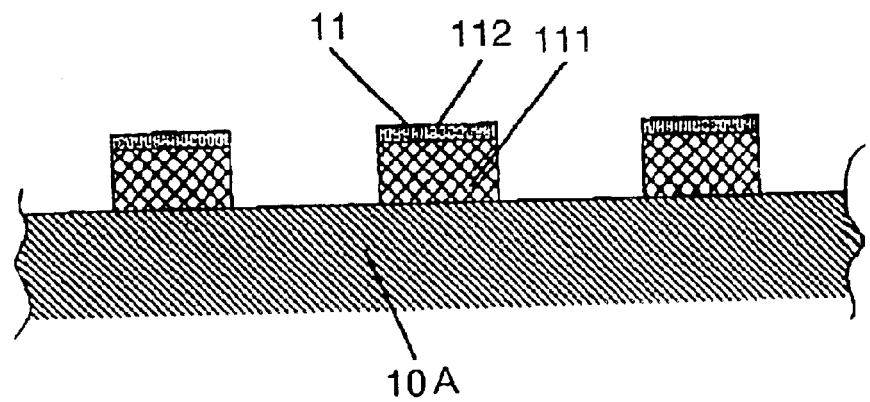
FIG. 2 is an enlarged sectional view of a primary part of the SAW device of Embodiments 1 to 5.
Figure 3:
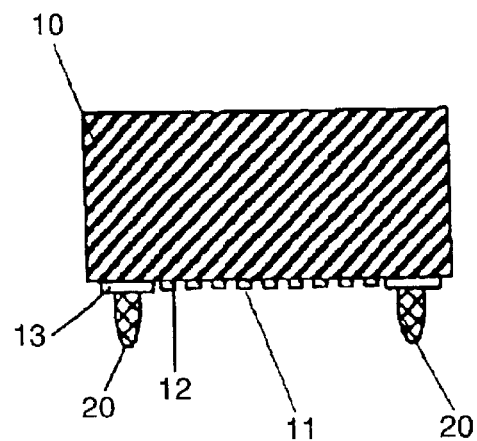
FIG. 3 is a cross sectional view of the SAW device of Embodiments 1 to 8.
Figure 4:
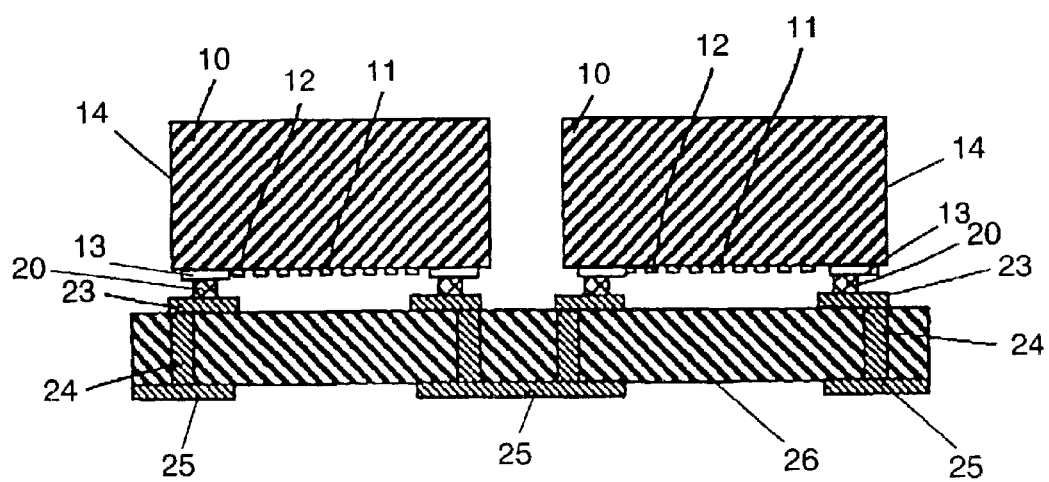
FIG. 4 is a cross sectional view of the SAW device of Embodiments 1 to 8.
Figure 5:
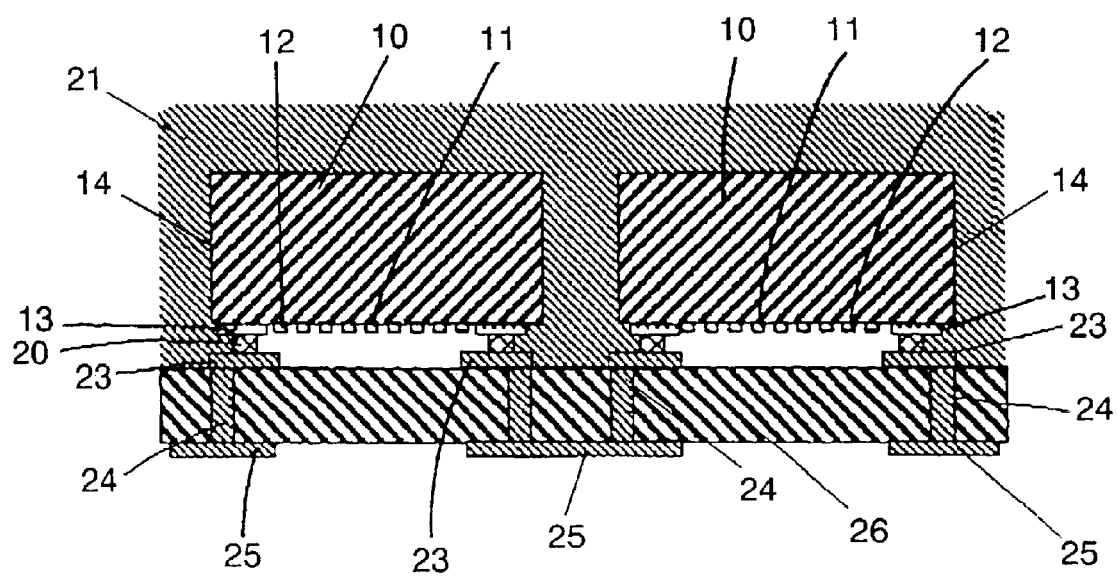
FIG. 5 is a cross sectional view of the SAW device of Embodiments 1 to 8.

FIG. 1 is a cross sectional view of a surface acoustic wave (SAW) device according to Embodiment 1 of the present invention. FIG. 2 is an enlarged view of a primary part of the SAW device shown in FIG. 1. FIGS. 3 to 5 are cross sectional views for explaining steps of fabricating the SAW device shown in FIG. 1.

The SAW device of Embodiment 1 includes a SAW element 14. The SAW element 14 includes a piezoelectric substrate 10 for propagating a surface acoustic wave, interdigital transducer (IDT) electrodes 11 for exciting the surface acoustic wave, reflector electrodes 12 at both sides of the IDT electrodes 11, and pad electrodes 13 connected electrically to the IDT electrodes 11. The electrodes are provided on the surface of the piezoelectric substrate 10. The piezoelectric substrate 10 of this embodiment is made of lithium tantalate, and it may be made of any other mono-crystalline piezoelectric material, such as lithium niobate, quarts, potassium niobate, or langesite, or of a piezoelectric thin-film, such as zinc oxide or aluminum nitride, provided on a silicon, sapphire, or glass base. The thickness of the piezoelectric substrate 10 is 350 μm. The IDT electrode 11 includes a first metal film 111 and a second metal film 112 deposited on the first metal film 111, as shown in FIG. 2. The first metal film 111 is made of aluminum or aluminum alloy (for example, containing 99 wt. % of aluminum and 1 wt. % of copper) having a thickness of 340 nm. The second metal film 112 is, but not limited to, made of titanium in this embodiment, and may be made of material selected from at least Ti, Zr, Nb, Ta, W, V, and Mn, having a thickness of 10 nm. The reflector electrodes 12 and the pad electrodes 13 have two-layer arrangement similar to the IDT electrodes 11.

A circuit board 26 has upper surface electrodes 23 on its upper surface and a terminal electrode 25 on its lower surface. The circuit board 26 has through holes which are provided therein and are filled with via electrodes 24 which connect between the surface electrodes 23 and the terminal electrodes 25. The circuit board 26 is made of glass epoxy, Teflon, polyimide, their film, or ceramic, such as alumina ceramic.

In the SAW element 14, the pad electrodes 13 and the surface electrodes 23 are fixed on the upper surface of the circuit board 26 via projection electrodes 20. The projection electrodes 20 are made of electrically conductive material, such as gold, tin, lead, copper, silver, nickel, or their alloy.

A resin coating 21 covers a periphery of the SAW element 14 between the piezoelectric substrate 10 and the circuit board 26 except an oscillation space 22 for the IDT electrodes 11. As long as desired characteristics are obtainable, the IDT electrodes 11 may partially touch the resin coating 21.

The resin coating 21 is made of epoxy resin, silicone resin, urethane resin, acryl resin, or their mixture which have an electrically insulating property and are non-detachable from the piezoelectric substrate 10 enough to form the oscillation space 22. The resin coating 21 may be doped with filler such as silicon dioxide, magnesium oxide, or aluminum oxide, for adjusting a thermal expansion factor of the coating. In Embodiment 1, the resin coating 21 is made of epoxy resin material.

A procedure of fabricating the SAW device of Embodiment 1 will be described.

The first metal film 111 is formed almost entirely over a large sheet-like piezoelectric substrate wafer 10A by sputtering. Similarly, the second metal film 112 is formed on the film 111.

Then, a resist pattern is provided by photolithography on the second metal film 112. The second metal film 112 and the first metal film 111 are etched in this order by reactive ion etching (RIE). Then, the resist pattern has been removed by ashing with oxygen plasma, and thus, the IDT electrodes 11, the reflector electrodes 12, and the pad electrodes 13 shown in FIG. 2 are developed. While the sputtering is used in Embodiment 1 for forming the first metal film 111 and the second metal film 112, the sputtering may be replaced by electron beam vapor CVD or vacuum heatup CVD. The RIE may be replaced by a known liftoff technique for providing the electrodes 11 and 12. In the RIE for the second metal film 112 and the first metal film 111, the etching action at a right angle to side walls may adversely be effected as known "side etching". This causes the side walls of the IDT electrodes 11 not to be perpendicular to the piezoelectric substrate 10, thus causing the walls to be tapered or inverse tapered or to be shaped concave or convex at the interface between the first metal film 111 and the second metal film 112. Any case may hardly decline the advantage of the present invention.

Then, the projection electrodes 20 are formed on the pad electrodes 13. Then, the piezoelectric substrate wafer 10 is divided into pieces to be the SAW elements 14 shown in FIG. 3. Since the projection electrodes 20 are joined to the surface electrodes 23 on the circuit board 26 by ultrasonic waves, the SAW element 14 is mounted on the circuit board 26. For the joining with the ultrasonic waves, the surface electrodes 23 and the projection electrodes 20 are made of gold.

Then, a sheet-like resin 21 is bonded over the SAW element 14 to a circuit board wafer 26A and is cured under pressure and heat, so that the resin fills between the SAW element 14 and the piezoelectric substrate 10. At this moment, a great care is taken to prevent the resin coating 21 from physical contact with the IDT electrodes 11. The construction of the resin coating 21 is not limited to the described method but may be implemented by application with a dispenser or the like. In the latter case, the resin coating 21 is made of highly viscous resin material to minimize the physical contact with the IDT electrodes 11.

Then, the circuit board wafer 26A is divided into pieces of a desired shape which turn to the SAW devices shown in FIG. 5.

The resin coating 21 generally contains chlorine ions and organic acid which are highly corrosive to the aluminum component of the IDT electrodes 11. If the SAW device is left under a high-temperature, high-moisture condition for a considerable length of time, the resin coating 21 is infiltrated with water, which may then accumulate adjacent to the IDT electrodes 11. During the infiltration, the water is doped with chlorine ions released from the resin coating 21 and then become acid at a location adjacent to the IDT electrodes 11. This causes the IDT electrodes 11 to develop contact corrosions by battery effect between two different metals depending on the combination of the first metal film 111 and the second metal film 112. As a result, the first metal film 121 may be corroded at the sides, which are not covered with the second metal film 121. As the IDT electrodes 11 is corroded, the SAW device will be declined in the properties.

The water doped with chloride ions remains as liquid or vapor and is corrosive to the IDT electrodes 11. Particularly under a saturated vaporizing pressure, the water stays as liquid and corrodes the IDT electrodes 11 more. Hence, the resin coating 21 is preferably made not only of the above listed material but also of material containing little chloride ion, which is highly corrosive to the IDT electrodes 11.

The SAW device was subjected to a pressure cooker test (PCT) which involved detention under a pressure of 2.03× $10^5$ Pa, a moisture of 100%, and a temperature of 120° C. Five different resin materials applicable to the SAW device of the embodiment were immersed in a pool of pure water having a mass 10 times greater than the resin materials and were left intact for twenty hours under the above conditions. The resultant liquid was analyzed by an ion chromatography. Concentration of chlorine ion is shown in Table 1.

TABLE 1

|  | Concentration of Chlorine Ion (ppm) |
| --- | --- |
| Resin Material A | 31 |
| Resin Material B | 51 |
| Resin Material C | 62 |
| Resin Material D | 70 |
| Resin Material E | 105 |

The SAW devices made of five of the above resin material by the described method were left under a pressure of $2.03 \times 10^5$ Pa, a moisture of 100%, and a temperature of 120° C. for forty hours, and were tested in their changes in their insertion loss. Hundred SAW devices for each different resin material were fabricated as SAW filters having a center frequency of 942.5 MHz. Filters having insertion loss increasing by 0.3 dB or more after the forty hours were regarded as defectives.

The result is shown in Table 2.

TABLE 2

|  | Number of Defectives |
| --- | --- |
| Resin Material A | 0 |
| Resin Material B | 0 |
| Resin Material C | 1 |
| Resin Material D | 15 |
| Resin Material E | 55 |

As apparent from Table 2, no defective is found among the filters of the resin materials A and B containing not more than 50 ppm of chlorine ion not more than 50 ppm shown in the table. However, defectives are found among the filters of the resin materials C, D, and E corresponding to the concentration of the chlorine ion more than the 62 ppm shown in the table. If the resin coating 21 enclosing the SAW element 14 is made of the resin material corresponding to the concentration of the chlorine ion shown in the table not more than 50 ppm measured by PCT, the IDT electrodes 11 can be prevented from corrosion.

After 1000 hours of a high-temperature, high-moisture test under a temperature of 85° C. and a moisture of 85%, no defective among the SAW devices having the resin coating made of the resin materials A, B, or C containing not more than 62 ppm of chloride ion is found.

The IDT electrodes 11 has a two-layer structure. If the resin material contains not more than 50 ppm of chlorine ion measured by the PCT, even the SAW device including an IDT electrodes of a single-layer structure made of aluminum or aluminum alloy may exhibit moisture resistance. However, the SAW device including the IDT electrodes having the two-layer structure exhibits higher moisture resistance.

(Embodiment 2)

The structure of a surface acoustic wave (SAW) device of Embodiment 2 is substantially identical to that of Embodiment 1 and can be fabricated by the same method. The resin coating 21 of this embodiment is however made of resin material which contain not more than 50 ppm of chlorine ion in the liquid not more than 50 ppm examined by a pressure cooker test (PCT) and contain different measurements of bromine ion examined by the PCT.

Similarly to Embodiment 1, the resin materials were immersed in a pool of pure water having a mass 10 times greater than that of each piece of the resin materials and were left intact for twenty hours under conditions of 120° C. and $2.03 \times 10^5$ Pa. The resultant liquid was analyzed by an ion chromatography and their measurements of the concentrations of the chlorine ion and the bromine ion are shown in Table 3.

TABLE 3

|  | Concentration of Chlorine Ion (ppm) | Concentration of Bromine Ion (ppm) |
| --- | --- | --- |
| Resin Material A | 31 | Not detected |
| Resin Material F | 33 | 280 |
| Resin Material G | 33 | 204 |
| Resin Material H | 33 | 182 |
| Resin Material I | 33 | 153 |
| Resin Material J | 33 | 96 |

Hundred SAW devices for each material, made of six of the resin material by the described method were left under a pressure of $2.03 \times 10^5$ Pa, a moisture of 100%, and a temperature of 120° C. for forty hours, and were tested in their changes of the insertion loss. The SAW devices of each different resin material were fabricated as SAW filters having a center frequency of 942.5 MHz. Filters having their insertion loss increasing by greater than 0.3 dB or more after the forty hours were regarded as defectives.

The result is shown in Table 4.

|  | Number of Defectives |
| --- | --- |
| Resin Material A | 0 |
| Resin Material F | 87 |
| Resin Material G | 45 |
| Resin Material H | 23 |
| Resin Material I | 0 |
| Resin Material J | 0 |

As apparent from Table 4, no defective is found among the filters of the resin materials A, I, and J containing not more than 150 ppm of bromine ion not more than 150 ppm shown in the table. However, defectives are found among the filters of the resin materials F, G, and H containing 80 ppm or more of bromine ion. If the resin coating 21 enclosing the SAW element 14 is made of the resin material corresponding to the concentration of the chlorine ion in the liquid not more than 50 ppm and the concentration of the bromine ion not more than 150 ppm measured by the PCT shown in the table, the IDT electrodes 11 can be further prevented from corrosion.

After 1000 hours of a high-temperature, high-moisture test under a temperature of 85° C. and a moisture of 85%, no defective is found among the SAW devices including the resin coating of any of the resin materials A, I, and J corresponding to the concentration of the chlorine ion in the liquid not more than 150 ppm.

(Embodiment 3)

A method of fabricating a surface acoustic wave (SAW) device according to Embodiment 3 of the present invention will be described.

The SAW device of this embodiment includes a second metal film 112 of interdigital transducer (IDT) electrodes 11 made of tantalum but not titanium. Other arrangements are identical to those of Embodiment 1 as fabricated by the same method.

Hundred SAW devices were subjected to a pressure cooker test (PCT) similarly to Embodiment 1. The result is shown in Table 5.

TABLE 5

|  | Number of Defectives |
| --- | --- |
| Resin Material A | 0 |
| Resin Material B | 0 |
| Resin Material C | 0 |
| Resin Material D | 7 |
| Resin Material E | 32 |

As apparent from Table 5, no defective is found among the devices of the resin materials A, B, C, and D corresponding to the concentration of the chlorine ion in th table not more than 60 ppm.

Similarly, the SAW devices of the resin materials A and F to J described in Embodiment 2 were examined in influence of the bromine ion. The result is shown in Table 6.

TABLE 6

|  | Number of Defectives |
| --- | --- |
| Resin Material A | 0 |
| Resin Material F | 88 |
| Resin Material G | 35 |
| Resin Material H | 7 |
| Resin Material I | 0 |
| Resin Material J | 0 |

As apparent from Table 6, no defective is found among the SAW devices of the resin material indicating the concentration of the bromine ion shown in the table not more than 150 ppm of bromine ion. For the resin material F, the number of defectives is almost equal to that of Embodiment 4. For the resin materials G and H, the number of defectives in this embodiment is smaller than that of Embodiment 2.

The SAW devices of Embodiment 3 have higher moisture resistance than those of Embodiments 1 and 2.

It is known that the normal electrode potential of titanium is closer to that of aluminum than to that of tantalum. In other words, a difference of the normal electrode potential between titanium and aluminum is smaller than that between tantalum and aluminum. Therefore, it is told that the corrosion by contact between two different metals more likely occurs for the second metal film 112 made of tantalum rather than of titanium, and the moisture resistance is more declined for a combination of tantalum and aluminum.

However, the result of this embodiment exhibits a reverse of what is told. For clarifying the advantage, an electrochemical test was carried out for measuring the electrode potential difference between the first metal film 111 and the second metal film 112 in consideration of the environment where the SAW device were placed in the test. With a reference electrode made of silver/silver chloride, a sample electrode made of the metal for the first metal film 111, and a counter electrode made of platinum in the test, the device was immersed in electrolyte solution (described later) for measuring a natural potential, i.e., a electrode potential having the corroding current remain substantially constant. Then, the metal of the second metal film 112 was examined similarly for measuring the natural potential. A difference between respective natural potentials of the two metals represents a difference between respective electrode potentials under the test environment. The smaller the difference, the more the corrosion by the contact between the two metals is reduced.

The electrolyte solution was prepared by dissolving 30 to 300 ppm of NaCl as an electrolyte into pure water based on a test result of the resin material 21 of the SAW device. The dose of NaCl has a range since the concentration of the chloride ion is not clearly found on the IDT electrodes 11 in the environmental test, such as the PCT.

The test was carried out with the counter electrode made of platinum and the sample electrode made of Al—Cu alloy or titanium. The difference between respective potentials between the two electrodes ranged from 35V to 0.45V.

In that case, the titanium electrode serves as a cathode, and the Al—Cu electrode serves as an anode. Thus, the Al—Cu alloy as the anode lost electrons, thus being corroded.

Similarly, the difference between respective potentials of the counter electrode made of platinum and the sample electrode made of Al—Cu alloy and tantalum was measured ranging from 0.25V to 0.35V. The cathode was the tantalum electrode, while the anode was the AL—Cu alloy electrode. The Al—Cu alloy as the anode was corroded as losing electrons.

Then, the same test was carried out for measuring a difference between respective potentials of the aluminum electrode and the Al—Cu alloy electrode. It is found that the Al—Cu alloy is shifted by 0.1 to 0.2V to a positive side (referred to as a noble side, while a negative side is referred to as a base side hereinafter) as compared with aluminum.

As apparent from above, when the SAW filter is located in a corrosive condition, the electrode potentials of the electrodes made of aluminum, Al—Cu alloy, tantalum, and titanium are more noble in this order.

More specifically, the SAW filter of Embodiment 3 allows the electrode potential difference between aluminum and titanium to increase by 0.45 to 0.65V greater than a known value.

Therefore, if the first metal film 111 is made of Al—Cu alloy, and if the second metal film 112 is made of tantalum, the electrode potential difference between the metal films 111 and 112 can be smaller than that with aluminum and titanium, respectively, hence reducing the corrosion of the IDT electrodes 11. In other words, the SAW device of Embodiment 3 has higher moisture resistance than that of Embodiment 1 and 2. The second metal film 112 may be made of material selected from Zr, Nb, W, V, and Mn. The material having a small electrode potential difference between the first metal film 111 and the second metal film 112 under the condition where the SAW device operates prevents the electrode from the corrosion, thus providing a SAW device having a high moisture resistance increased.

(Embodiment 4)

A surface acoustic wave (SAW) device according to Embodiment 4 of the present invention is that of Embodiment 1 in which a second metal film 112 made of any metal selected from Zr, Nb, Cr, W, V, Mn, Pt, Au, and Pd. A resin coating 21 is made of either the resin material B of Embodiment 1 or the resin material I of Embodiment 2. The second metal film 112 of this embodiment is selected from metal having higher moisture resistance itself and serves as a cathode against aluminum and an aluminum alloy for a first metal film 111.

Hundred SAW devices of Embodiment 4 were subjected to a pressure cooker test (PCT) and a high-temperature, high-moisture test similarly to Embodiment 1. No defective is found among the SAW devices having the second metal film 112 made of Zr, Nb, W, V, Cr, or Mn regardless of the type of the resin material. In the SAW devices with the second metal film 112 made of Pt, Au, or Pd, an electrode potential difference between the first metal film 111 and the second metal film 112 is large, thus causing the first metal film 111 to be corroded at its sides and declining their characteristics.

As described, the SAW device including the resin 21 corresponding to the concentration of the chlorine ion in the liquid not more than 50 ppm and corresponding to the concentration of the bromine ion in the liquid not more than 150 ppm exhibits high moisture resistance if the second metal film 112 is made of any metal selected from Ti, Zr, Nb, Ta, W, V, Cr, and Mn.

(Embodiment 5)

A surface acoustic wave (SAW) device according to Embodiment 5 of the present invention has a structure identical to that of Embodiment 1, but different in the composition of the second metal film 112 of the IDT electrode 11. More specifically, the second metal film 112 of this embodiment is made of aluminum alloy containing 30 wt. % of titanium.

The SAW device of this embodiment can have a smaller electrode potential difference between the first metal film 111 and the second metal film 112 by 0.15 to 0.25V than that of Embodiment 1. This reduces corrosion by contact between two different metals, and improves the moisture resistance. The electrode potential difference was measured similarly to Embodiment 3.

The mass of the second metal film 112 of this embodiment is smaller by 72% and 19.5% than that of Embodiments 1 and 3, respectively. As a result, if the IDT electrode 11 have a mass equal to that of Embodiment 1 and 3, the first metal film 111 can be thicker, thus decreasing electric resistance of the IDT electrodes 11. Accordingly, the SAW device of this embodiment has a reduced insertion loss.

The IDT electrode 11 can have the increased thickness, hence improving the yield rate of the SAW devices. This is because characteristics of the SAW device change due to the mass of the IDT electrodes 11. For example, the smaller the specific gravity of the metal in the IDT electrode 11, the more the thickness of the IDT electrode 11 can increase. This can absorb an error of the precision of deposition by sputtering, thus improving the yield rate of the device.

According to Embodiment 5, the second metal film 112 is made of, but not limited to, Al—Ti alloy containing 30 wt. % of titanium. The second metal film 112 may be made of any other metal containing different rate of Ti and aluminum alloy containing at least one metal selected from Zr, Nb, Ta, W, V, Cr, and Mn with equal effect.

(Embodiment 6)

Figure 6:
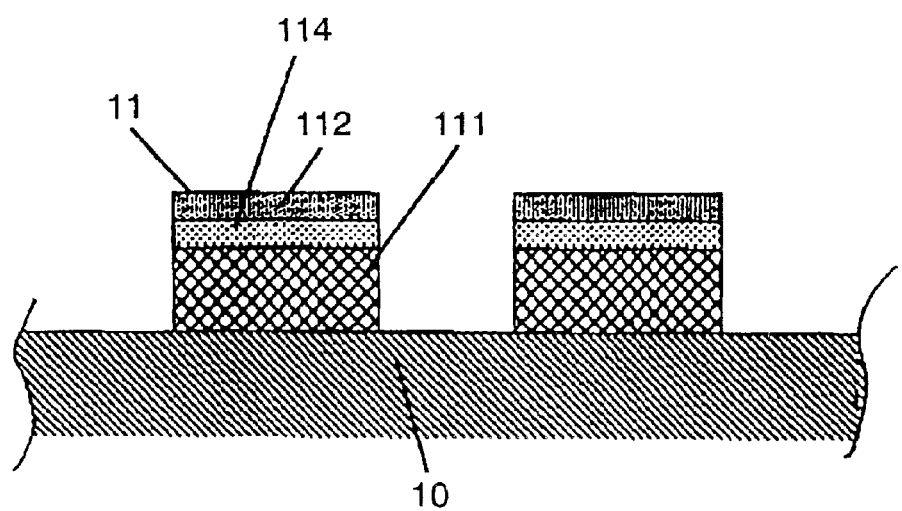
FIG. 6 is a cross sectional view of the SAW device of Embodiment 6.

FIG. 6 is an enlarged cross sectional view of a primary part of a surface acoustic wave (SAW) device according to Embodiment 6 of the present invention. The SAW device of this embodiment has a structure identical to that of Embodiment 1 except that the construction of an interdigital transducer (IDT) electrodes 11 is different.

The IDT electrode 11 of Embodiment 6 includes an alloy layer 114 between the first metal film 111 and the second metal film 112 and is made of alloy containing metal of the first metal film 111 and metal of the second metal film 112.

The first metal film 111 of a thickness of 340 nm is made of aluminum alloy containing, for example, 99 wt. % of aluminum and 1 wt. % of copper. The second metal film 112 of 10 nm thick contains titanium. The alloy layer 114 is made of alloy containing aluminum, a primary ingredient of the first metal film 111, and titanium, a primary ingredient of the second metal film 112.

A method of fabricating the SAW device of Embodiment 6 will be explained.

The first metal film 111 made of aluminum or an aluminum based material and the second metal film 112 made of titanium are deposited in this order on the piezoelectric substrate 10 by sputtering.

Then, a resist pattern is provided on the second metal film 112 by photolithography.

Then, the second metal film 112 and the first metal film 111 are etched in this order by a reactive ion etching (RIE). As the resist pattern has been removed by ashing with oxygen plasma, the IDT electrodes 11, the reflector electrodes 12, and the pad electrodes 13 are formed, as shown in FIG. 6.

The piezoelectric substrate 10 on which the IDT electrodes 11 are patterned is heated up for diffusing aluminum in the first metal film 111 and titanium in the second metal film 112. As a result, the alloy layer 114 containing both aluminum and titanium is developed between the first metal film 111 and the second metal film 112.

The heating process is carried out commonly at a temperature range of 150 to 500° C. or preferably 150 to 350° C. The temperature for heating being lower than 150° C. may discourage the dispersion of aluminum and titanium. The temperature exceeding 500° C., which is close to a melting point of aluminum of 660° C., may hardly stabilize the resultant IDT electrode 11 in its characteristics.

The heating process may be performed preferably under 150 to 350° C. The temperature not higher than 350° C. is preferable for preventing the characteristics of the SAW device from declining due to electric intensity breakage. It is noted that the IDT electrode 11 may be free from such electric intensity breakage even when being heated massively depending on a pattern of the electrode.

The succeeding steps are identical to those of Embodiment 1.

The SAW devices of Embodiment 6, the SAW devices of Embodiment 1, and comparative sample including an IDT electrode 11 made of a single layer of aluminum alloy doped with 1 wt. % of copper were subjected to a pressure cooker test (PCT) similarly to Embodiment 1 for examining their insertion losses.

The SAW devices of this embodiment, similarly to Embodiment 1, were provided as SAW filters having a center frequency of 942.5 MHz. A SAW filter having an insertion loss increasing by 0.3 dB or more after forty hours was judged as a defective. 100 units for each model were examined.

As a result, all the comparative examples are defective. No defective is found among the SAW devices of Embodiments 1 and 6. The SAW devices of Embodiment 6 have the insertion loss change less than those of Embodiment 1 and more improved moisture resistance.

The IDT electrodes were visually inspected with a scan-type electron microscope. In the SAW devices of Embodiment 6, the first metal film 111 made of aluminum based material is less corroded at their side than those of Embodiment 1.

This will be explained in more detail.

The IDT electrodes 11 having a two-layer structure, such as explained in Embodiment 1, produces a discontinuous electrode potential difference between the first metal film 111 and the second metal film 112. When acid water exists around the IDT electrode 11, the first metal film 121 is more affected by corrosion by contact between two metals. In the SAW device of Embodiment 6, the intermediate alloy layer 114 between the first metal film 121 and the second metal film 122 developed by thermal diffusion of the two metals prevents the discontinuous electrode potential difference from being produced, hence contributing to attenuation of the corrosion by contact between two metals.

The second metal film 112 of Embodiment 6 is made of, but not limited to, titanium. The film 112 may be made of any metal selected from Zr, Nb, Ta, W, V, and Mn with equal effect.

The heating process of Embodiment 6 is carried out after the IDT electrodes 11 is formed, and however, the process may be carried out with equal effect after the deposition of the second metal film 112. Thus, the heating process for the electrodes may be shared with the curing process for the resin coating 21. In the latter case, the heating temperature preferably ranges from 150 to 500° C. This can prevent the SAW device from declined in its characteristics due to electric intensity breakage. The electric intensity breakage is preferably eliminated to proceed the heating process for yielding the alloy layer 114 before the development of the IDT electrodes 11 where the electrode potential difference remains small on the piezoelectric substrate 10.

(Embodiment 7)

A surface acoustic wave (SAW) device according to Embodiment 7 of the present invention will be described referring to FIGS. 1, 3 to 5, and 7. Like components are denoted by like numerals as those of Embodiment 1 and will be explained in no more detail.

The SAW device of Embodiment 7 is differentiated from that of Embodiment 1 by a construction of an interdigital transducer (IDT) electrodes 11. The IDT electrodes 11 of Embodiment 7 has a three-layer structure. A third metal film 113 of a 10 nm thickness containing at least one metal selected from Ti, Zr, Nb, Ta, W, V, and Mn is provided on the piezoelectric substrate 10. The first metal film 111 of a 340 nm thickness is made of aluminum alloy containing 99 wt. % of aluminum and 1 wt. % of copper. The second metal film 112 provided on the first metal film 111 of a 10 nm thickness contains at least one metal selected from Ti, Zr, Nb, Ta, W, V, and Mn.

A method of fabricating the SAW device of Embodiment 7 will be explained.

Figure 7:
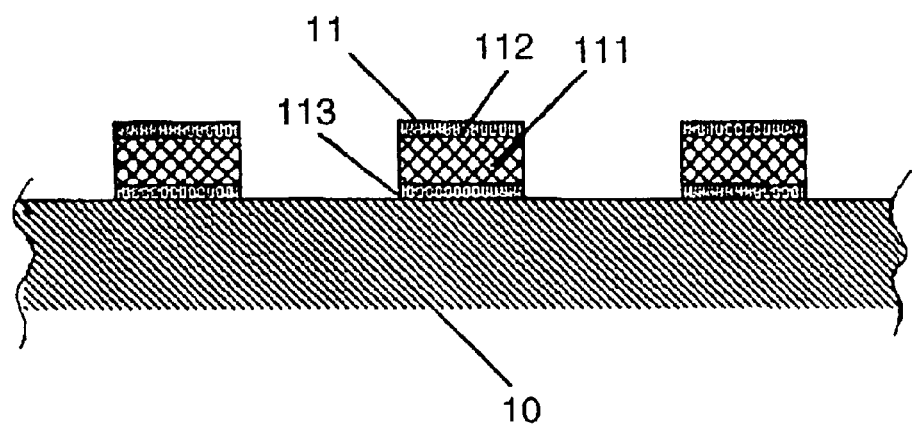
FIG. 7 is an enlarged cross sectional view of a primary part of the SAW device of Embodiment 7.

The third metal film 113, the first metal film 111, and the second metal film 112 are deposited in this order almost entirely on the piezoelectric substrate 10 by sputtering. Then, a resist pattern is provided on the second metal film 112 by photolithography. Then, the second metal film 112, the first metal film 111, and the third metal film 113 are etched in this order by a reactive ion etching (RIE). As the resist pattern has been removed by ashing with oxygen plasma, the IDT electrode 11, a reflector electrode 12, and a pad electrode 13 are formed, as shown in FIG. 7. The succeeding steps are identical to those for Embodiment 1.

The SAW devices of Embodiment 7, the SAW devices of Embodiment 1, and comparative example having an IDT electrodes 11 including a single layer of aluminum alloy doped with 1 wt. % of copper were subjected to a pressure cooker test (PCT) similarly to Embodiment 1. The SAW devices, similarly to Embodiment 1, were provided as SAW filters having a center frequency of 942.5 MHz. A SAW filter having its insertion loss increasing by 0.3 dB or more after forty hours was judged as a defective. 100 units for each type were examined.

As a result, all the comparative examples are defective. No defective is found among the SAW devices of both Embodiments 1 and 7. The SAW devices of Embodiment 7 have their insertion loss changed less than those of Embodiment 1, and have more improved moisture resistance. They were subjected to 1000 hours of a high-temperature, high-moisture test under a temperature of 85° C. and a moisture of 85%. This test proves that the SAW devices of Embodiment 7 are improved in the moisture resistance.

The IDT electrodes 11 were visually inspected with a scan-type electron microscope. It is found that the IDT electrodes of Embodiment 1 exhibit a higher degree of the corrosion on aluminum at the sides of the first metal film 111 than those of Embodiment 7.

This will be explained in more detail.

The third metal film 113 made of high-melting-point metal, such as titanium, under the first metal layer 111 improves its crystalline orientation. The crystalline orientation particularly in the first metal film 111 of the SAW device of Embodiments 7 and 1 were examined by an X-ray diffraction technique. It is found that the first metal film 111 of the SAW device of this embodiment is oriented along (111) planes, while the first metal film 111 of the SAW device of Embodiment 1 is polycrystalline having random crystalline orientations.

That is, The first metal film 111 of the SAW device of Embodiment 1 is polycrystalline, and additional ingredient, such as copper, is separated as a crystalline particle. The separated copper collaborates with aluminum of the main ingredient to locally form a galvanic cell. As the IDT electrodes 11 is exposed to the cell effect, aluminum, which is electrically more basic than copper, may be corroded.

The SAW device of Embodiment 7 includes the third metal film 113 beneath the first metal film 111, thus having the enhanced crystalline orientation in the first metal film 111. This can suppress the corrosion of a crystalline particle due to local cell effect, hence allowing the SAW device to have a higher moisture resistance.

The third metal film 113 of Embodiment 7 is, but not limited to, composed of a single layer. The film 113 may be composed of two or more layers with equal success. For example, a third metal film 113 (or a second metal film 112), a first metal film 111, a third metal film 113, a first metal film 111 . . . may be disposed one over the other from the piezoelectric substrate 10 with the same effect.

(Embodiment 8)

Figure 8:
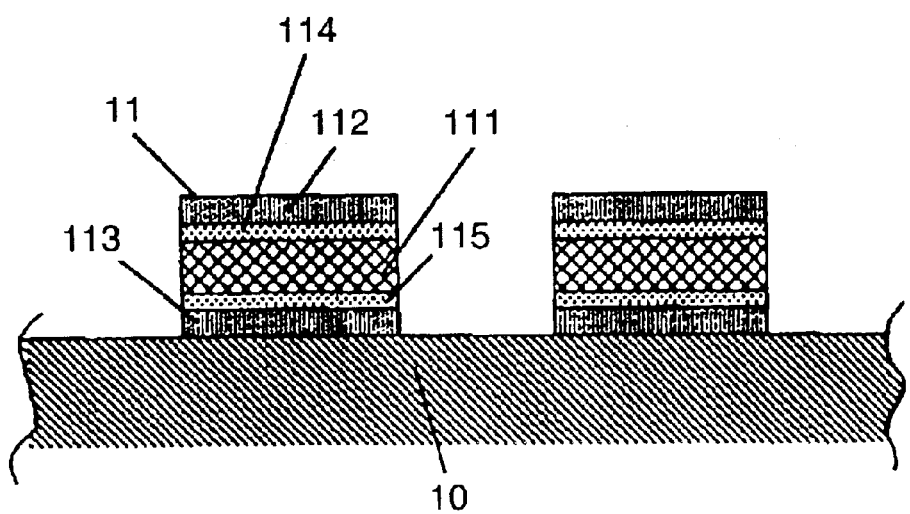
FIG. 8 is an enlarged cross sectional view of a primary part of the SAW device of Embodiment 8.

FIG. 8 is an enlarged cross sectional view of a primary part of a surface acoustic wave (SAW) device according to Embodiment 8 of the present invention. Like components are denoted by like numerals as those shown in FIG. 7 and will be explained in no more detail.

The SAW device of Embodiment 8 is differentiated from that of Embodiment 7 by that an interdigital transducer (IDT) electrode 11 provided on the piezoelectric substrate 10 includes an alloy layer 115 between a first metal film 111 and a third metal film 113 and another alloy layer 114 between the first metal film 111 and the second metal film 112. The layer 115 contains respective main materials of the films 111 and 113, and the layer 113 contains respective main materials of the films 111 and 112.

The first metal film 111 of 320 nm thickness is made of aluminum alloy containing 99 wt. % of aluminum and 1 wt. % of copper. The second metal film 112 and the third metal film 113 are made of titanium of 10 nm thick. The alloy material of the alloy layers 114 and 115 contains aluminum and titanium.

A method of fabricating the SAW device of Embodiment 8 will be explained.

The third metal film 113 made of titanium, the first metal film 111 made of aluminum or titanium, and the second metal film 112 made of titanium are disposed in this order on the piezoelectric substrate 10 by sputtering.

Then, a resist pattern is provided on the second metal film 112 by photolithography. Then, the second metal film 112, the first metal film 111, and the third metal film 113 are etched in this order by a reactive ion etching (RIE). As the resist pattern has been removed by ashing with oxygen plasma, the IDT electrode 11, a reflector electrode 12, and a pad electrode 13 are formed, as shown in FIG. 8.

The piezoelectric substrate 10 on which the IDT electrodes 11 are patterned is heated up for having aluminum and titanium diffuse and for switching over between the first metal film 111 and the second metal film 112 and between the first metal film 111 and the third metal film 113. This provides the alloy layers 114 and 115 containing both aluminum and titanium. The heating process is carried out commonly at a temperature of 150 to 500° C., or preferably 150 to 350° C. The succeeding steps are identical to those for Embodiment 7.

The SAW devices of Embodiment 8, the SAW devices of Embodiments 6 and 7, and comparative examples having the IDT electrodes 11 consisting of a single layer of aluminum alloy doped with 1 wt. % of copper were subjected to a pressure cooker test (PCT) similarly to Embodiment 1. More specifically, the SAW devices were left under a pressure of $2.03 \times 10^5$ Pa and at a moisture of 100% for fourth hours, and were measured in their insertion loss. The SAW devices were provided as SAW filters having a center frequency of 942.5 MHz, similarly to Embodiment 1. A SAW filter having its insertion loss increasing by 0.3 dB or more after forty hours was judged as a defective. 100 units for each type were examined.

As a result, all the comparative examples are defective. No defective is found among the SAW devices of Embodiment 8 and both Embodiments 6 and 7. The SAW devices of Embodiment 8 have their insertion loss changed less than those of Embodiments 6 and 7, and have more improved moisture resistance.

The IDT electrodes 11 were visually inspected using a scan-type electron microscope. It is then found that the IDT electrodes of the SAW devices of Embodiments 6 and 7 exhibit a higher degree of the corrosion on aluminum at the sides of the first metal film 111 made mainly of aluminum. The SAW device of Embodiment 8 has no sign of the corrosion and is improved in the moisture resistance.

Figure 9:
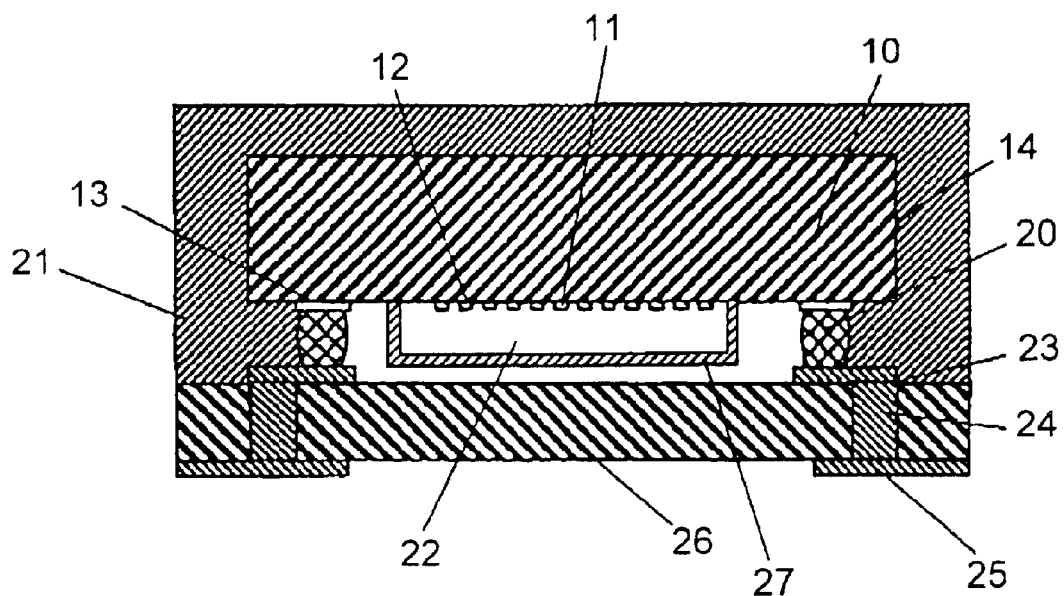
FIG. 9 is a cross sectional view of another SAW device of Embodiment 8.
Figure 10:
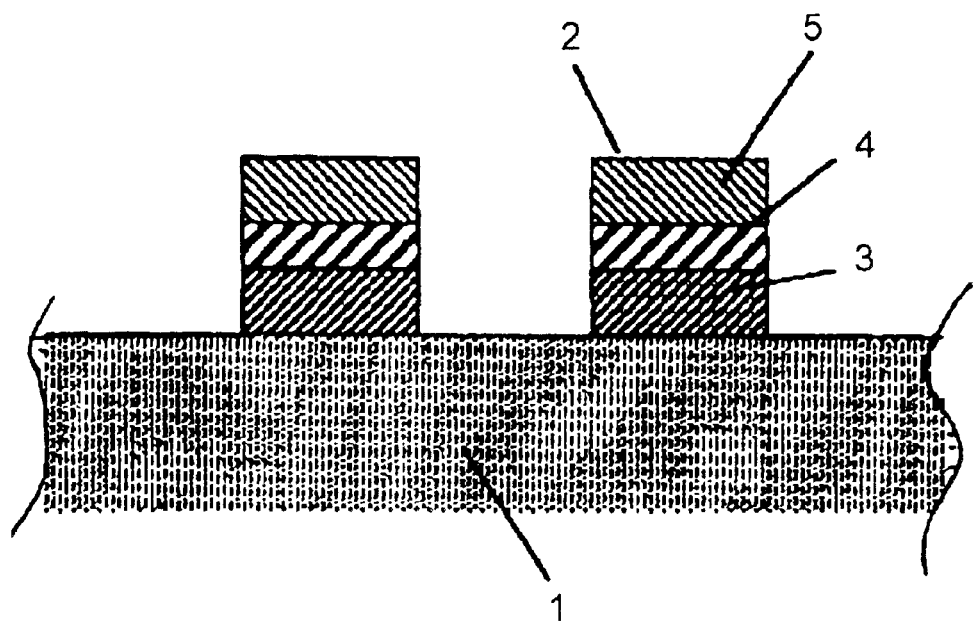
FIG. 10 is an enlarged cross sectional view of a primary part of a conventional SAW device.

In the foregoing embodiments, the SAW element 14 is tightly covered at its periphery with the resin coating 21, while allowing an oscillation space to be clearly formed for the IDT electrodes 11. As shown in FIG. 9, a resin cover 27 may be added over the piezoelectric substrate 10 to protect the upper space above the IDT electrodes 11 with equal success. If a resin material is used for forming the space to enclose the SAW element 14 or is exposed to the enclosing space, the concentration of chlorine ion measured by the PCT is preferably not higher than 50 ppm. If the resin material is doped with a filler, the resin coating 21 permits water from the outside of the SAW device to move along a longer pass before the water reach the oscillation space for the IDT electrodes 11. This declines the water absorptivity of the resin coating 21. Accordingly, as compared with no-filler doped resin material which has the same concentration of the chloride or bromide ion, the resin material doped with filler permits less amounts of water to reach the IDT electrodes 11, hence contributing to the higher moisture resistance of the SAW device.

INDUSTRIAL APPLICABILITY

The SAW device can be improved in moisture resistance, upon including a resin coating made of specific resin material according to the present invention for covering an interdigital transducer electrode.

What is claimed is:

1. A surface acoustic wave (SAW) device comprising:

a piezoelectric substrate;

an interdigital transducer (IDT) electrode on a first surface of said piezoelectric substrate; and a resin coating for covering said IDT electrode, wherein, after a piece of resin material of said resin coating is dipped in an amount of pure water as solvent having a mass as 10 times great as said piece of the resin material at 120° C. under 2 atom pressure for ) twenty hours, a concentration of chlorine ion in said solvent is not higher than 50 ppm.

2. A SAW device according to claim 1, wherein, after a piece of the resin material of said resin coating is dipped in an amount of pure water as solvent having a mass as 10 times great as said piece of resin material at 120° C. under 2 atom pressure for twenty hours, a concentration of bromine ion in said solvent is not higher than 150 ppm.

3. A SAW device according to claim 1, wherein said resin coating covers a second surface and a side of said piezoelectric substrate.

4. A SAW device according to claim 1, further comprising a resin cover made of said resin material for covering over a periphery and said IDT electrode.

5. A SAW device according to claim 1, wherein said IDT electrode includes:

a first layer containing aluminum on said piezoelectric substrate; and a second layer containing at least one of Ti, Zr, Nb, Ta, W, V, and Mn over said first layer.

6. A SAW device according to claim 5, wherein said second layer contains aluminum.

7. A SAW device according to claim 5, wherein said IDT electrode further includes a third layer between said first and second layers, said third layer containing respective components of said first and second layers.

8. A SAW device according to claim 1, wherein said IDT electrode includes:

a first layer containing at least one of Ti, Zr, Nb, Ta, W, V, and Mn on said piezoelectric substrate;

a second layer containing aluminum over said first layer; and a third layer containing at least one of Ti, Zr, Nb, Ta, W, V, and Mn over said second layer.

9. A SAW device according to claim 8, wherein said third layer contains aluminum.

10. A SAW device according to claim 8, wherein said IDT electrode further includes:

a fourth layer between said first and second layers, said fourth layer containing respective components of said first and second layers; and a fifth layer between said second and third layers, said fifth layer containing respective components of said second and third layers.

11. A SAW device according to claim 1, wherein said resin material contains filler.

* * * * *

UNITED STATES PATENT AND TRADEMARK OFFICE
CERTIFICATE OF CORRECTION

PATENT NO.         : 6,998,687 B2  
APPLICATION NO. : 10/240426  
DATED                 : February 14, 2006  
INVENTOR(S)       : Takashi Inoue et al.

Page 1 of 1

It is certified that error appears in the above-identified patent and that said Letters Patent is hereby corrected as shown below:

Add To Cover Page

-- (30) Foreign Application Priority Data  
January 30, 2001  (JP)......................2001-21153  
January 30, 2001  (JP)......................2001-21154--

Title Page, (56) References Cited, FOREIGN PATENT DOCUMENTS  
Delete duplicate reference JP 10163799 A Title Page, (56) References Cited, FOREIGN PATENT DOCUMENTS  
Delete duplicate reference JP 11163661

Signed and Sealed this

Twenty-second Day of August, 2006

JON W. DUDAS  
*Director of the United States Patent and Trademark Office*